United States Patent
Youn et al.

(10) Patent No.: US 7,371,669 B2
(45) Date of Patent: May 13, 2008

(54) METHOD OF FORMING A GATE OF A SEMICONDUCTOR DEVICE

(75) Inventors: Sun-Pil Youn, Seoul (KR); Chang-Won Lee, Gyeonggi-do (KR); Woong-Hee Sohn, Gyeonggi-do (KR); Gil-Heyun Choi, Gyeonggi-do (KR); Jong-Ryeol Yoo, Gyeonggi-do (KR); Jang-Hee Lee, Seoul (KR); Jae-Hwa Park, Gyeonggi-do (KR); Dong-Chan Lim, Seoul (KR); Byung-Hak Lee, Gyeonggi-do (KR); Hee-Sook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 231 days.

(21) Appl. No.: 11/283,121

(22) Filed: Nov. 18, 2005

(65) Prior Publication Data

US 2006/0110900 A1 May 25, 2006

(30) Foreign Application Priority Data

Nov. 19, 2004 (KR) ............. 10-2004-0094894

(51) Int. Cl.
*H01L 21/3205* (2006.01)

(52) U.S. Cl. ............. 438/585; 438/592; 438/596; 438/275

(58) Field of Classification Search ............. 438/410, 438/669, 694, 700, 706, 275, 279, 286, 592, 438/585, 596, 758, 437, 42; 257/E21.179
See application file for complete search history.

(56) References Cited

U.S. PATENT DOCUMENTS

| | | | | |
|---|---|---|---|---|
| 6,133,096 A | * | 10/2000 | Su et al. ............. | 438/264 |
| 6,784,038 B2 | * | 8/2004 | Tanabe et al. ........ | 438/199 |
| 6,861,356 B2 | * | 3/2005 | Matsuse et al. ...... | 438/653 |
| 6,992,010 B2 | * | 1/2006 | Chou et al. .......... | 438/694 |
| 7,211,497 B2 | * | 5/2007 | Hiraiwa et al. ...... | 438/424 |

FOREIGN PATENT DOCUMENTS

| KR | 10-2001-0039009 | 5/2001 |
|---|---|---|
| KR | 10-2003-0080239 | 10/2003 |

\* cited by examiner

*Primary Examiner*—Kiesha Rose
*Assistant Examiner*—Chakila Tillie
(74) *Attorney, Agent, or Firm*—Myers Bigel Sibley & Sajovec

(57) ABSTRACT

In a method for forming a gate in a semiconductor device, a first preliminary gate structure is formed on a substrate. The first preliminary gate structure includes a gate oxide layer, a polysilicon layer pattern and a tungsten layer pattern sequentially stacked on the substrate. A primary oxidation process is performed using oxygen radicals at a first temperature for adjusting a thickness of the gate oxide layer to form a second preliminary gate structure having tungsten oxide. The tungsten oxide is reduced to a tungsten material using a gas containing hydrogen to form a gate structure. The tungsten oxide may not be formed on the gate structure so that generation of the whiskers may be suppressed. Thus, a short between adjacent wirings may not be generated.

22 Claims, 8 Drawing Sheets

METHOD OF FORMING A GATE OF A SEMICONDUCTOR DEVICE

CROSS REFERENCE TO RELATED APPLICATIONS

This application claims priority under 35 USC § 119 to Korean Patent Application No. 2004-94894, filed on Nov. 19, 2004, the contents of which are herein incorporated by reference in its entirety.

FIELD OF THE INVENTION

The present invention relates generally to semiconductors and, more particularly, to semiconductor gates.

BACKGROUND OF THE INVENTION

Semiconductor devices have become complicated multi-layered structures. Further, semiconductor devices have become highly integrated. Thus, reducing the electrical resistance of conductive patterns such as gate electrodes has become desirable.

Generally, a polysilicon layer pattern is employed in a gate electrode. To decrease electrical resistance of a gate electrode, a metal silicide layer pattern is formed on the polysilicon layer pattern. To reduce the electrical resistance of a gate electrode, a tungsten layer pattern is conventionally formed on the polysilicon layer pattern.

A conventional method of forming a gate electrode includes sequentially stacking a tungsten layer pattern and a polysilicon layer pattern.

For example, a polysilicon layer and a tungsten layer are sequentially formed on a semiconductor substrate. The polysilicon layer and the tungsten layer are partially etched to form a polysilicon layer pattern and a tungsten layer pattern.

However, when the etching process is performed, etching damage may be generated at surface portions of the substrate, the polysilicon layer pattern and the tungsten layer pattern due to plasma used in the etching process. Thus, an additional oxidation process (sometimes referred to as a re-oxidation process) for curing the etching damage is performed on the substrate, the polysilicon pattern and the tungsten pattern.

The re-oxidation process is performed in a furnace or rapid thermal processing (RTP) equipment at a temperature of no less than about 800° C. under an oxygen atmosphere or a water vapor atmosphere. When the re-oxidation process is performed at the above-mentioned high temperature, etching damage is sufficiently cured. On the contrary, a gate oxide layer may have a greater thickness than desired due to an excessive bird's beak. The term "bird's beak" is well understood by those skilled in the art and need not be explained further. This is referred to as a punch-through phenomenon of a gate oxide layer. The punch-through phenomenon may cause variable threshold voltage of a transistor or deteriorating reliability of the gate oxide layer.

To overcome the above-mentioned problems, a radical oxidation process that is performed at a relatively low temperature has been proposed to replace the re-oxidation process. Although the radical oxidation process may improve the punch-through phenomenon of the gate oxide layer, efficiency for curing the etching damage may be reduced and the gate electrode may not have a sufficiently rounded edge.

The re-oxidation process is performed under a condition that tungsten in the gate electrode is not oxidized. However, it is very difficult to prevent the oxidation of tungsten in the gate electrode. In particular, when the gate electrode is oxidized by the radical oxidation process, a sufficient amount of oxygen is provided to the gate electrode to round the edge of the gate electrode. However, when a flux of oxygen is increased, tungsten in the gate electrode is oxidized to form tungsten oxide (WOx) on a surface of the tungsten layer pattern.

When a heat budget is applied to the tungsten oxide material, needle-shaped whiskers grow. Because the whiskers include a conductive material, a short between wirings may be generated due to the whiskers. As a result, a semiconductor device incorporating the gate electrode may operate abnormally.

Examples of methods for removing the tungsten oxide material are disclosed in Korean Patent Laid-Open Publication Nos. 2001-0039009 and 2003-0080239.

However, an oxidation process and a process for removing the tungsten oxide material disclosed in the above-mentioned Publications are performed at a relatively high temperature of no less than about 800° C. Thus, a bird's beak is generated in the gate oxide layer so that the punch-through phenomenon of the gate oxide layer occurs.

SUMMARY OF THE INVENTION

Embodiments of the present invention provide a method of forming a gate for a semiconductor device that is capable of suppressing a punch-through and a short between wirings.

In a method of forming a gate of a semiconductor device in accordance with an embodiment of the present invention, a first preliminary gate structure is formed on a substrate. The first preliminary gate structure includes a gate oxide layer, a polysilicon layer pattern and a tungsten layer pattern sequentially stacked on the substrate. The first preliminary gate structure is oxidized using oxygen radicals under a first temperature for adjusting a thickness of the gate oxide layer to form a second preliminary gate structure having tungsten oxide that is partially formed on a surface of the second preliminary gate structure. A gas including hydrogen is applied to the second preliminary gate structure to reduce the tungsten oxide to tungsten, thereby completing a gate structure.

In a method of forming a gate of a semiconductor device in accordance with another embodiment of the present invention, a first preliminary gate structure is formed on a substrate. The first preliminary gate structure includes a tunnel oxide layer, a first polysilicon layer pattern, an oxide/nitride/oxide (ONO) layer pattern, a second polysilicon layer pattern and a tungsten layer pattern sequentially stacked on the substrate. The first preliminary gate structure is oxidized using oxygen radicals under a first temperature for adjusting a thickness of the gate oxide layer to form a second preliminary gate structure having tungsten oxide that is partially formed on a surface of the second preliminary gate structure. A gas including hydrogen is applied to the second preliminary gate structure to reduce the tungsten oxide to tungsten, thereby completing a gate structure.

According to embodiments of the present invention, since whiskers that are generated in the oxidation process are reduced to the tungsten, generation of the whiskers due to a subsequent heat budget may be suppressed. Thus, a short between adjacent wirings may not be generated so that a yield of a semiconductor device may be improved. Further, since the oxygen radicals are used in the oxidation process, a punch-through phenomenon of the gate oxide layer may be suppressed.

BRIEF DESCRIPTION OF THE DRAWINGS

The above and other features and advantages of the present invention will become more apparent by describing in detailed exemplary embodiments thereof with reference to the accompanying drawings, in which.

DESCRIPTION OF THE EMBODIMENTS

Figure 1:
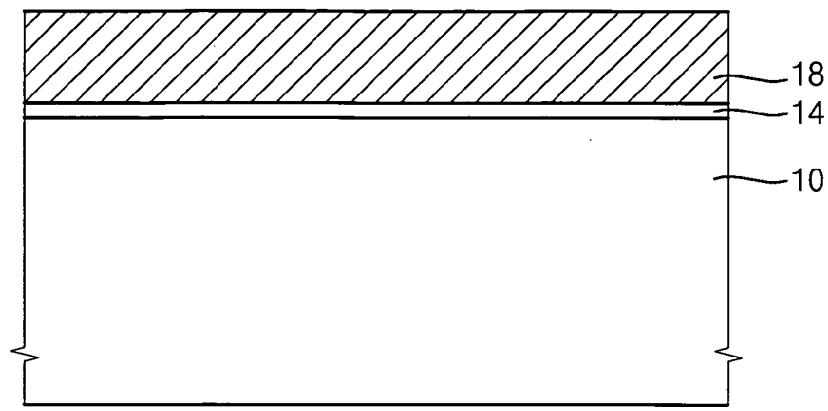
FIGS. 1 to 6 are cross sectional views illustrating a method of manufacturing a non-volatile memory device in accordance with a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment 1

FIGS. 1 to 6 are cross sectional views illustrating a method of manufacturing a non-volatile memory device in accordance with a first exemplary embodiment of the present invention.

Referring to FIG. 1, an isolation region (not shown) of a silicon substrate 10 is selectively etched to form an isolation trench at a surface portion of the silicon substrate 10. Then, an insulation layer is formed in the trench and on the silicon substrate 10. The insulation layer is polished by a chemical mechanical polishing (CMP) process to form an isolation pattern (not shown) in the trench. An active region and the isolation region of the silicon substrate 10 are defined by the CMP process.

A tunnel oxide layer 14 is grown from exposed portions of the silicon substrate 10, which are the active region.

A first polysilicon layer (not shown) doped with impurities is formed on the tunnel oxide layer 14. The first polysilicon layer is used as a floating gate electrode by a subsequent process. The first polysilicon layer may be doped with P-type impurities. Alternatively, when the first polysilicon layer is used as the floating gate electrode of a memory device, the first polysilicon layer may be doped with N-type impurities to improve electrical characteristics of a transistor.

Then, the first polysilicon layer is etched in a direction X substantially in parallel with the active region to form a linear first preliminary polysilicon layer pattern 18.

Figure 2:
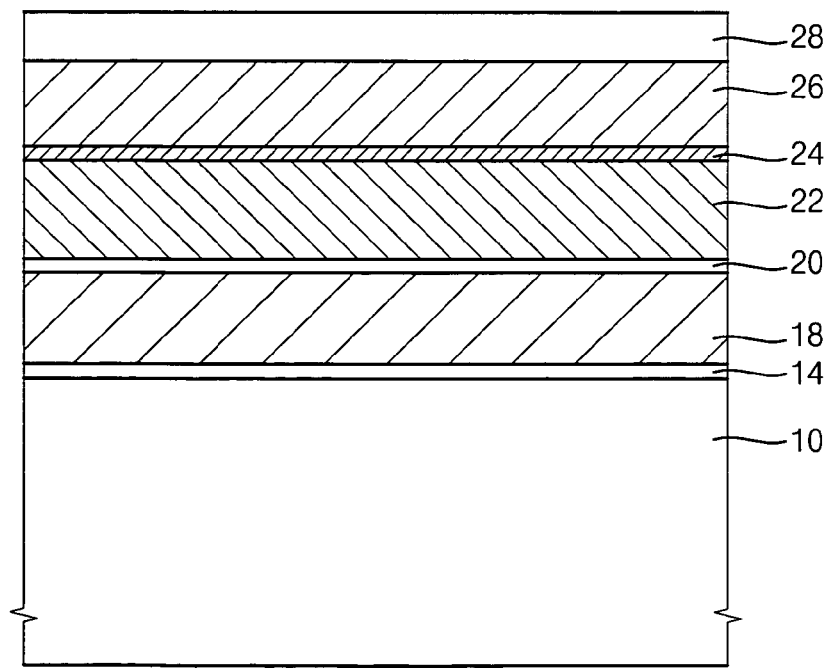

Referring to FIG. 2, an oxide/nitride/oxide (ONO) layer 20 is successively formed on the first preliminary polysilicon pattern 18.

A second polysilicon layer 22 is formed on the ONO layer 20. A tungsten nitride layer 24 that serves as a barrier layer for preventing tungsten from diffusing is formed on the second polysilicon layer 22. The tungsten nitride layer 24 may have a thickness of about 10 Å to about 100 Å. A tungsten layer 26 is formed on the tungsten nitride layer 24. The second polysilicon layer 22, the tungsten nitride layer 24, and the tungsten layer 26 are utilized as a control gate electrode by a subsequent process. A silicon nitride layer 28 as a hard mask is then formed on the tungsten layer 26.

Figure 3:
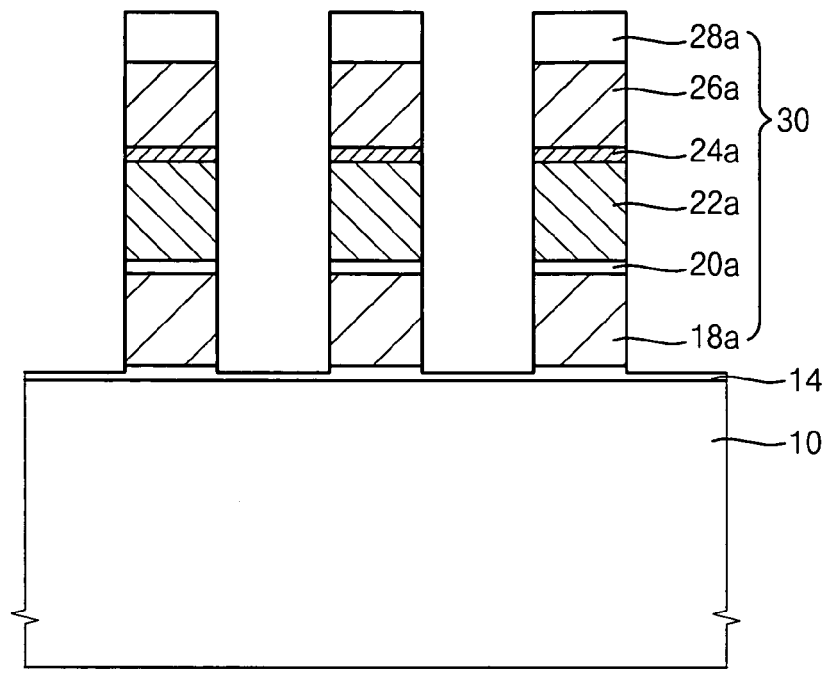

Referring to FIG. 3, the silicon nitride layer 28 is partially etched by a photolithograph process to form a hard mask pattern 28a. The hard mask pattern 28a extends in a direction substantially perpendicular to the first preliminary polysilicon layer pattern 18.

The tungsten layer 26, the tungsten nitride layer 24, the second polysilicon layer 22, the ONO layer 20, and the first preliminary polysilicon layer pattern 18 are successively etched using the hard mask pattern 28a as an etching mask to form a first preliminary gate structure 30.

In particular, the first preliminary polysilicon layer pattern 18 is etched to form a first polysilicon layer pattern 18a having an isolated shape. Further, a linear ONO layer pattern 20a, a second polysilicon layer pattern 22a, a tungsten nitride layer pattern 24a and a tungsten layer pattern 26a are sequentially formed on the first polysilicon layer pattern 18a. That is, the first preliminary structure 30 includes the first polysilicon layer pattern 18a, the ONO layer pattern 20a, the second polysilicon layer pattern 22a, the tungsten nitride layer pattern 24a, and the tungsten layer pattern 26a sequentially stacked.

After performing the etching process, the tunnel oxide layer 14 remains on an entire upper surface of the silicon substrate 10. When all of the tunnel oxide layer 14 is completely removed from the silicon substrate 10 by the etching process, an exposed portion of the silicon substrate 10 may be directly damaged by plasma so that a failure such as an active pitting may occur on the silicon substrate 10.

Figure 4:
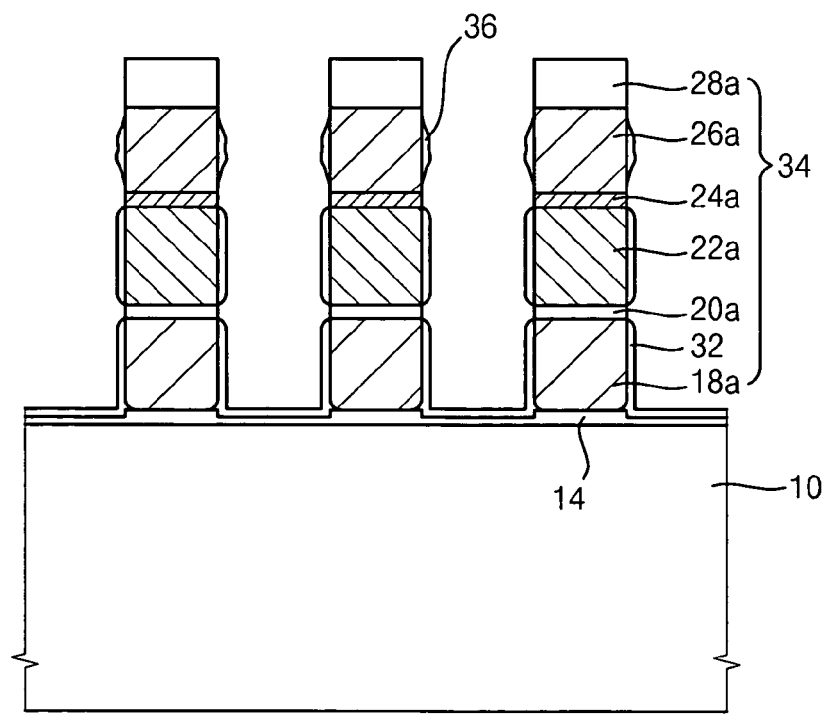

Referring to FIG. 4, a primary oxidation process is performed on the substrate 10 having the first preliminary gate structure 30 using oxygen radicals to form a second preliminary gate structure 34. In particular, an oxygen gas, a hydrogen gas and an argon gas are applied to the first preliminary gate structure 30. A plasma power is applied to the gases to generate an oxygen radical, a hydroxyl (OH) radical, etc. The radicals are reacted with the first preliminary gate structure 30 to form an oxide layer 32 on the first polysilicon layer pattern 18a, the second polysilicon layer pattern 22a, and the tunnel oxide layer 14 of the first preliminary gate structure 30.

Here, to prevent a gate oxide layer including the tunnel oxide layer 14 and the oxide layer 32 from excessively thickening due to bird's beak at edges of the gate oxide layer, the primary oxidation process may be carried out at an optimally controlled temperature. In this embodiment, the primary oxidation process may be performed at a temperature of about 200° C. to about 400° C.

Figure 7:
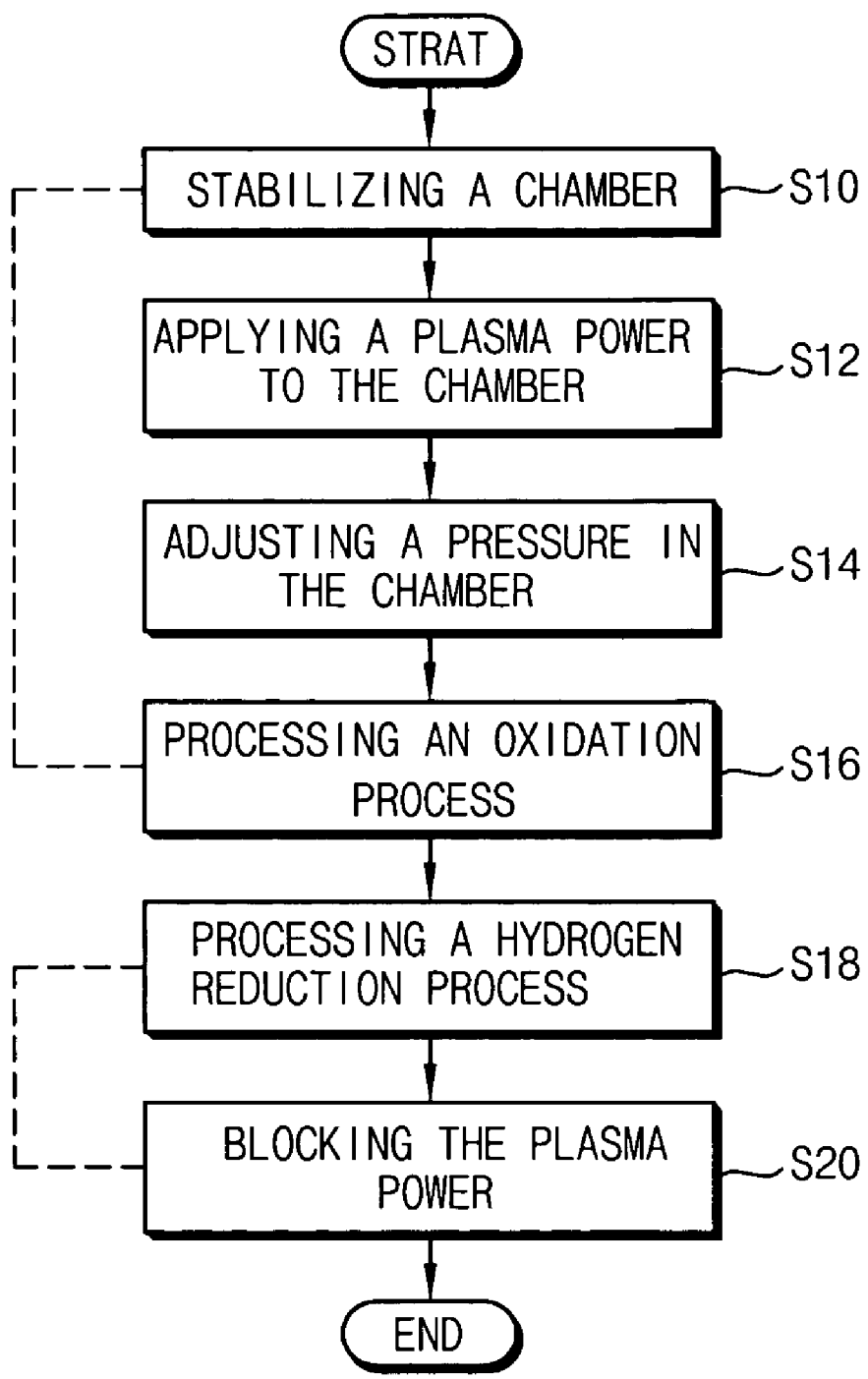
FIG. 7 is a flow chart illustrating an oxidation process and a hydrogen reduction process in accordance with the first exemplary embodiment of the present invention.

FIG. 7 is a flow chart illustrating a primary oxidation process and a hydrogen reduction process in accordance with Embodiment 1 of the present invention.

Hereinafter, the primary oxidation process will be described in detail with reference to FIG. 7.

In step S10, the silicon substrate having the first preliminary gate structure 30 is loaded into a chamber. A pressure and a temperature in the chamber are controlled to stabilize the chamber. An inert gas may be introduced into the chamber to adjust the pressure in the chamber. The chamber has a temperature of about 200° C. to about 400° C., preferably about 250° C. to about 280° C.

In step S12, a plasma power for generating plasma in the chamber is applied into the chamber. In this embodiment, the plasma power is within a range of about 1,000 W to about 5,000 W.

In step S14, a pressure suitable for the primary oxidation process is provided to the chamber with the plasma power being continuously applied. In the present embodiment, the pressure is about 1 mTorr to 100 mTorr.

In step S16, when the chamber is maintained under the pressure, the hydrogen gas and oxygen gas are introduced into the chamber to perform the primary oxidation process. Additionally, an inert gas such as an argon gas may be introduced into the chamber together with the hydrogen gas and oxygen gas. The argon gas functions so as to rapidly generate the plasma. That is, when the argon gas is not introduced into the chamber, the plasma is slowly generated so that the primary oxidation process may be too long.

When the hydrogen gas and oxygen gas are introduced into the chamber together with the argon gas, an oxygen radical and a hydroxyl radical are generated. The oxygen radical and the hydroxyl radical are then applied to the substrate 10. The oxygen radical and the hydroxyl radical are reacted with the first and second polysilicon layer patterns 18a and 22a of the first preliminary gate structure, and a portion of the tunnel oxide layer that is disposed between the first preliminary gate structures to form the oxide layer.

In the primary oxidation process, etching damage generated in forming the first preliminary gate structure may be cured. Further, the first and second polysilicon layer patterns 18a and 22a may have sufficiently rounded edges. Furthermore, a thickness of the tunnel oxide layer may not be excessively increased due to a bird's beak phenomenon.

Here, when the first and second polysilicon patterns 18a and 22a have sharp edges, an electric field is concentrated on the sharp edge of the first polysilicon pattern 18a to leak a current through the sharp edge of the first polysilicon pattern 18a.

The primary oxidation process using the oxygen radicals may be performed at a temperature of about 200° C. to about 400° C., preferably, about 240° C. to about 300° C. Thus, since the primary oxidation process of the present embodiment is carried out at a temperature lower than that of a conventional oxidation process using a furnace, the thickness of the tunnel oxide layer 14 may be little increased.

On the contrary, when the primary oxidation process is performed at a relatively low temperature, the first and second polysilicon patterns 18a and 22a may not have sufficiently rounded edges. To provide the rounded edges to the edge portion of the first polysilicon pattern 18a, a sufficient amount of the oxygen gas may be introduced into the chamber. In particular, the oxygen gas has a flux of no less than about 0.4 times that of the hydrogen gas. Preferably, a flux ratio between the oxygen gas and the hydrogen gas is about 1:1 to about 1:2.5.

Referring again to FIG. 4, when the flux of the oxygen gas is increased, a sidewall of the tungsten layer pattern 26a of the first preliminary polysilicon structure is partially oxidized to form tungsten oxide (WOx) 36 on the sidewall of the tungsten layer pattern 26a.

Figure 5:
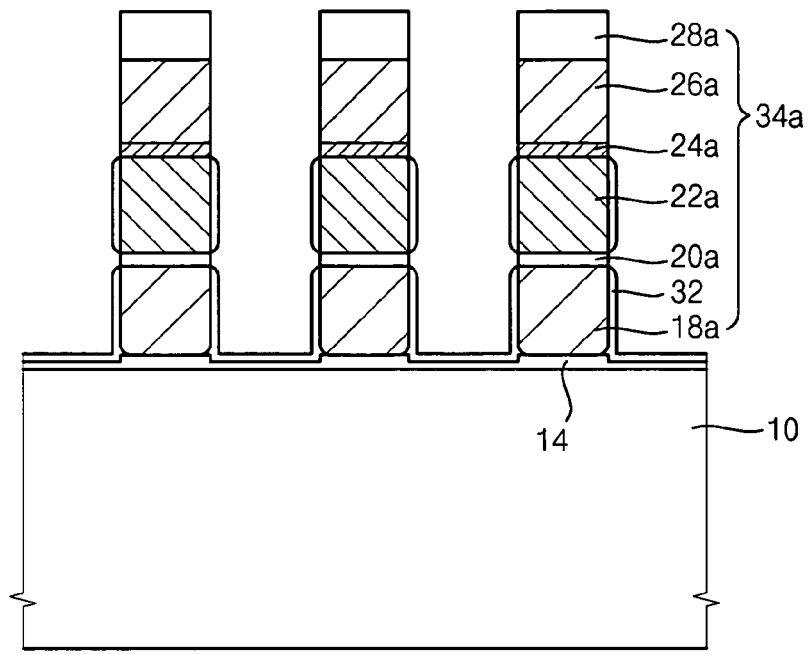

Referring to FIG. 5, after performing the primary oxidation process, a reduction gas including hydrogen is introduced in-situ into the chamber to reduce the tungsten oxide on the sidewall of the tungsten layer pattern 26a into tungsten, thereby completing the gate structure 34a without the tungsten oxide. In this embodiment, examples of the reduction gas may include hydrogen gas and $NH_3$ gas. These can be used alone or a mixture thereof. In this embodiment, the reduction gas including hydrogen is used alone.

Hereinafter, a process for reducing tungsten using hydrogen will be described in detail with reference to FIG. 7.

Referring again to FIG. 7, in step S18, after performing the primary oxidation process, the oxygen gas is no longer provided to the chamber. The hydrogen gas and/or the $NH_3$ gas is then introduced into the chamber with the plasma power being provided. Alternatively, an inert gas such as an argon gas may be introduced into the chamber together with the hydrogen gas and/or the $NH_3$ gas. In this embodiment, the process for reducing tungsten may be performed at a temperature of about 200° C. to about 400° C. In the view of a stabilization of the reduction process, the temperature and pressure of a tungsten reduction process may be substantially identical to those of the primary oxidation process.

The hydrogen gas and/or the $NH_3$ gas is introduced into the chamber for no less than 30 seconds, preferably, about 30 seconds to about 300 seconds. However, when the hydrogen gas and/or the $N H_3$ gas is introduced into the chamber for less than 30 seconds, a tungsten reduction reaction by hydrogen is not sufficiently generated so that the tungsten oxide 36 partially remains on the tungsten layer pattern 26a. On the contrary, when the hydrogen gas and/or the $NH_3$ gas is introduced into the chamber for more than 300 seconds, a process for forming the gate structure is too long. In this embodiment, a time for introducing the hydrogen gas or the $NH_3$ gas into the chamber may vary in accordance with a flux of the hydrogen gas or the $NH_3$ gas.

In step S20, the plasma power is no longer applied to the chamber with the hydrogen gas and/or the $NH_3$ gas being introduced. An introducing of the hydrogen gas or the $NH_3$ gas is suspended, thereby completing the hydrogen reduction process.

As described above, when the gas including hydrogen is introduced into the chamber, oxygen atoms included in the tungsten oxide are reacted with hydrogen atoms to reduce the tungsten oxide into tungsten. Further, a byproduct such as $H_2O$ or OH that is generated by a reaction between the oxygen atoms and hydrogen atoms is exhausted to the outside. Thus, since the tungsten oxide is removed from the gate structure, whiskers, which grow from the tungsten oxide in a subsequent thermal process, may not be generated.

Figure 6:
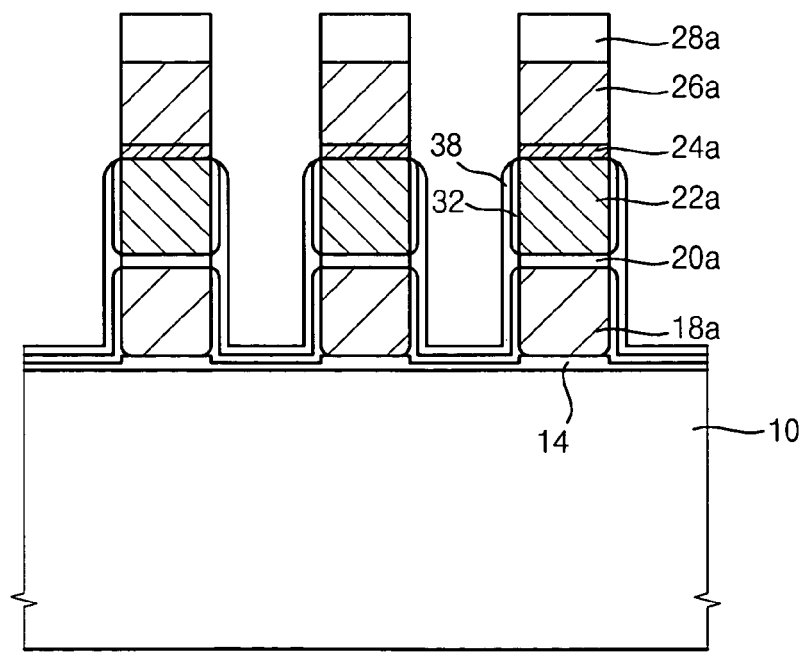

Referring to FIG. 6, a secondary oxidation process is carried out on the gate structure to cure etching damage to the gate structure. Alternatively, the secondary oxidation process may be omitted for simplifying the process for the gate structure. The secondary oxidation process is performed in a furnace type apparatus or a single substrate-processing type apparatus at a temperature of about 700° C. to about 800° C. Thus, the second oxide layer 38 is formed on the first oxide layer 32 by the secondary oxidation process.

Here, although the secondary oxidation process is performed at a temperature of no less than about 700° C., whiskers may not be generated on the gate structure because the tungsten oxide does not remain on a sidewall of the tungsten layer pattern.

Additionally, a nitride spacer (not shown) is formed on the sidewall of the gate structure. Impurities are then implanted into the substrate to form source/drain regions. Wirings are electrically connected to the source/drain regions to complete a non-volatile memory device.

Forming a Gate Structure

Figure 8:
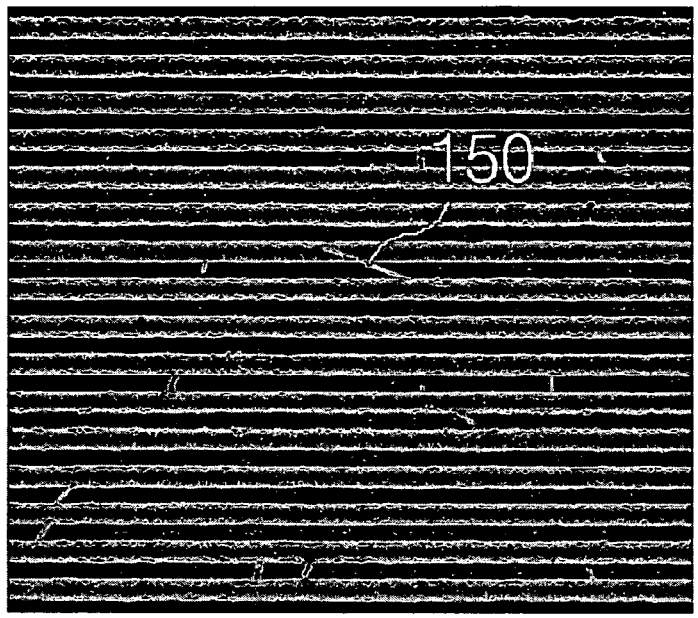
FIG. 8 is a scanning electron microscope (SEM) picture illustrating a gate structure formed by a conventional method.
Figure 9:
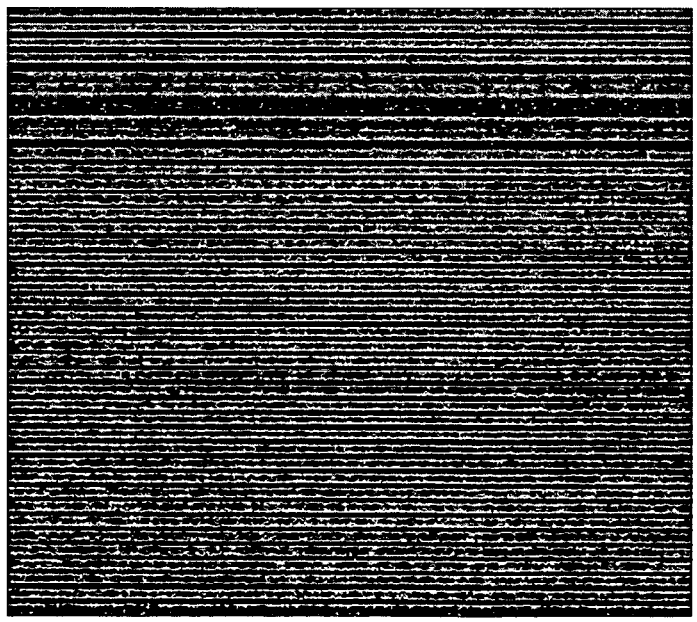
FIG. 9 is an SEM picture illustrating a gate structure formed by the method in accordance with the first exemplary embodiment of the present invention.

FIG. 8 is an SEM picture illustrating a gate structure formed by a conventional method. FIG. 9 is an SEM picture illustrating a gate structure formed by the method of Embodiment 1 of the present invention.

A gate structure was formed by the method in Embodiment 1. In particular, an oxidation process using oxygen radicals was performed on a semiconductor substrate. A hydrogen reduction process that included applying a hydrogen gas and an argon gas to the semiconductor substrate for about 60 seconds was then carried out on the semiconductor substrate. The semiconductor substrate was thermally treated at a temperature of about 860° C. to complete the gate structure.

Further, a gate structure was formed by a conventional method under conditions that are substantially identical to those in Embodiment 1 excluding the hydrogen reduction process.

As shown FIG. 9, after performing the thermal process, plurality of whiskers was generated on the conventional gate structure. On the contrary, as shown in FIG. 8, after performing the thermal process, whiskers were not generated on the gate structure of Embodiment 1.

Embodiment 2

A method of forming a non-volatile memory device in Embodiment 2 is substantially identical to that in Embodiment 1 except for performing a hydrogen reduction process in a separate chamber. Thus, an oxidation process and the hydrogen reduction process are predominantly illustrated.

Processes substantially identical to those illustrated with reference to FIGS. 1 to 3 are carried out to form a first preliminary gate structure on a semiconductor substrate.

The oxidation process using oxygen radicals is then performed in a first chamber to convert the first preliminary gate structure into a second preliminary gate structure. The semiconductor substrate is loaded into a second chamber 56 with vacuum being continuously provided. The hydrogen reduction process is then carried out in the second chamber 56.

Figure 10:
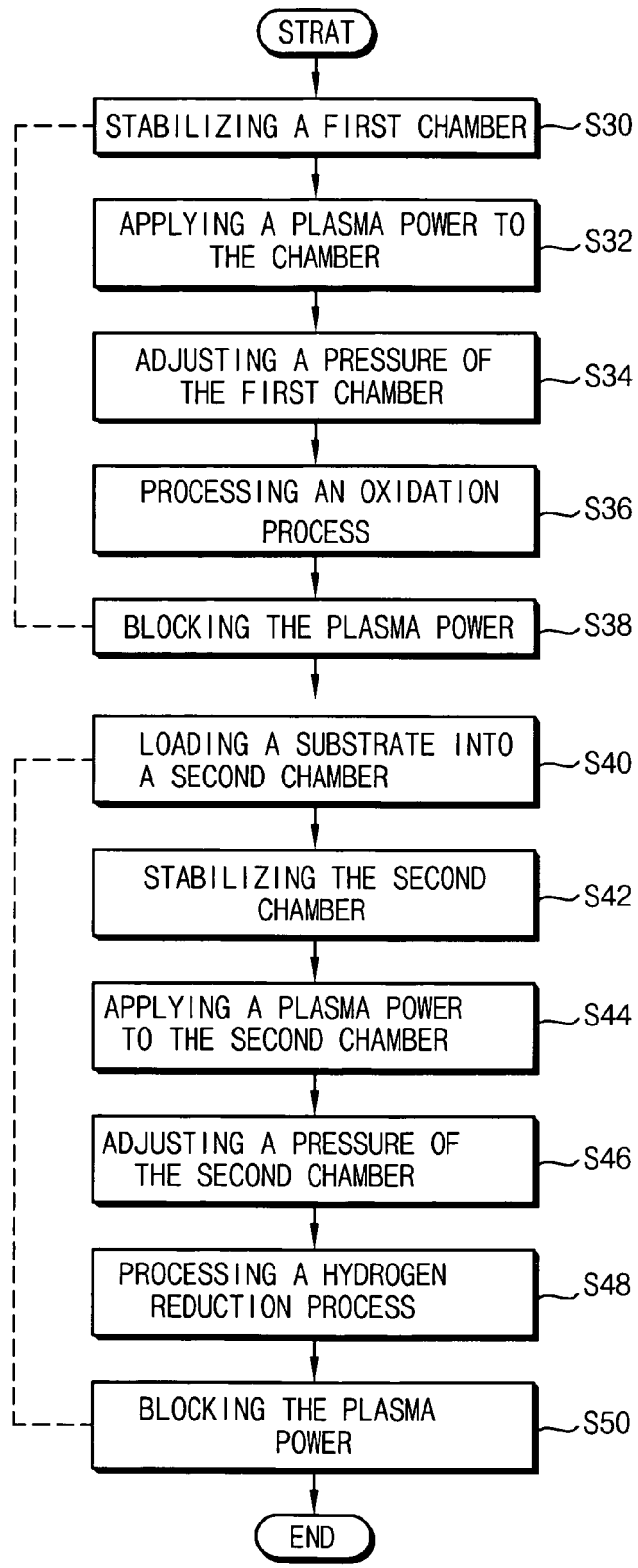
FIG. 10 is a flow chart illustrating an oxidation process and a hydrogen reduction process in accordance with a second exemplary embodiment of the present invention.
Figure 11:
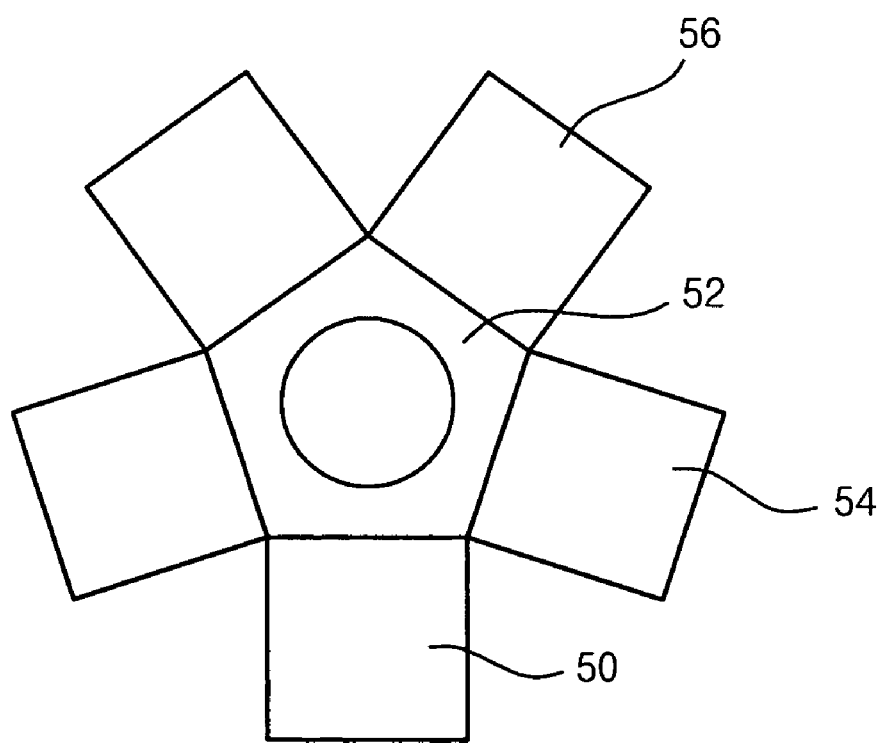
FIG. 11 is a plan view illustrating a chamber of processing equipment for performing the oxidation process and the hydrogen reduction process in FIG. 10.

FIG. 10 is a flow chart illustrating a primary oxidation process and a hydrogen reduction process in accordance with the second exemplary embodiment of the present invention. FIG. 11 is a plan view illustrating an apparatus for performing the primary oxidation process and the hydrogen reduction process in accordance with the present embodiment.

Hereinafter, the primary oxidation process and the hydrogen reduction process are illustrated in detail with reference to FIGS. 10 and 11.

First of all, the substrate is introduced into a loadlock chamber 50. The substrate is loaded into a first chamber 54 through a transfer chamber 52. In step S30, a first pressure and a temperature in the first chamber 54 are controlled to stabilize the first chamber 54. An inert gas may be introduced into the first chamber 54 to adjust the pressure in the first chamber 54. A temperature of the first chamber 54 is about 200° C. to about 400° C.

In step S32, a plasma power for generating plasma in the first chamber 54 is applied into the first chamber 54. In this embodiment, the plasma power is within a range of about 1,000 W to about 5,000 W.

In step S34, a second pressure suitable for the primary oxidation process is provided to the first chamber 54 with the plasma power being continuously applied.

In step 36, when the first chamber 54 is maintained under the second pressure, hydrogen gas and oxygen gas are introduced into the first chamber 54 to generate an oxygen radical and a hydroxyl radical. The oxygen radical and the hydroxyl radical are then applied to the substrate. To provide a rounded edge to a first polysilicon pattern 18a, a sufficient amount of the oxygen gas may be introduced into the chamber. In particular, the oxygen gas has a flux of no less than about 0.4 times that of the hydrogen gas.

In step S38, the plasma power is no longer applied to the first chamber 54 with the oxygen gas, the hydrogen gas and the argon gas being introduced. An introducing of the oxygen gas, the hydrogen gas and the argon gas is then suspended.

The substrate is transferred into the transfer chamber 52 from the first chamber 54. Here, the vacuum is continuously provided to the transfer chamber 52.

In step S40, the substrate is loaded into a second chamber 56 from the transfer chamber 52.

In step S42, a pressure and a temperature in the second chamber 56 are controlled to stabilize the second chamber 56. An inert gas may be introduced into the first chamber 56 to adjust the pressure in the second chamber 56. The second chamber 56 has a temperature of about 200° C. to about 400° C.

In step S44, a plasma power for generating plasma in the second chamber 56 is applied into the second chamber 56. In this embodiment, the plasma power is within a range of about 1,000 W to about 5,000 W.

In step S46, a pressure of about 1 mTorr to about 100 mTorr is applied to the second chamber 56.

In step S48, a hydrogen gas and an $NH_3$ gas are introduced into the second chamber 56 for no less than 30 seconds, preferably, about 30 seconds to about 300 seconds. Additionally, an inert gas such as an argon gas may be introduced into the second chamber 56. A time for introducing the hydrogen gas and the $NH_3$ gas into the second chamber 56 may vary in accordance with fluxes of the hydrogen gas and the $NH_3$ gas.

When the hydrogen gas is introduced into the second chamber 56, oxygen atoms in the tungsten oxide are reacted with hydrogen atoms to reduce the tungsten oxide into tungsten. Further, a byproduct such as $H_2O$ or OH that is generated by a reaction between the oxygen atoms and hydrogen atoms is exhausted to an outside. Thus, since the tungsten oxide is removed from the gate structure, whiskers that grow from the tungsten oxide in a subsequent thermal process may not be generated.

In step S50, the plasma power is no longer applied to the second chamber 56 with the hydrogen gas and the argon gas being introduced. An introduction of the hydrogen gas and the argon gas is suspended. The substrate is unloaded into the loadlock chamber 50 from the second chamber 56.

The oxidation process and the hydrogen reduction process are carried out in the first and second chambers 54 and 56 connected to each other via the loadlock chamber 50, respectively. Since the oxidation process and the hydrogen reduction process are performed with the vacuum being continuously provided, a native oxide layer may be little generated.

Processes substantially identical to those in Embodiment 1 are performed to complete the non-volatile memory device.

Embodiment 3

Figure 12:
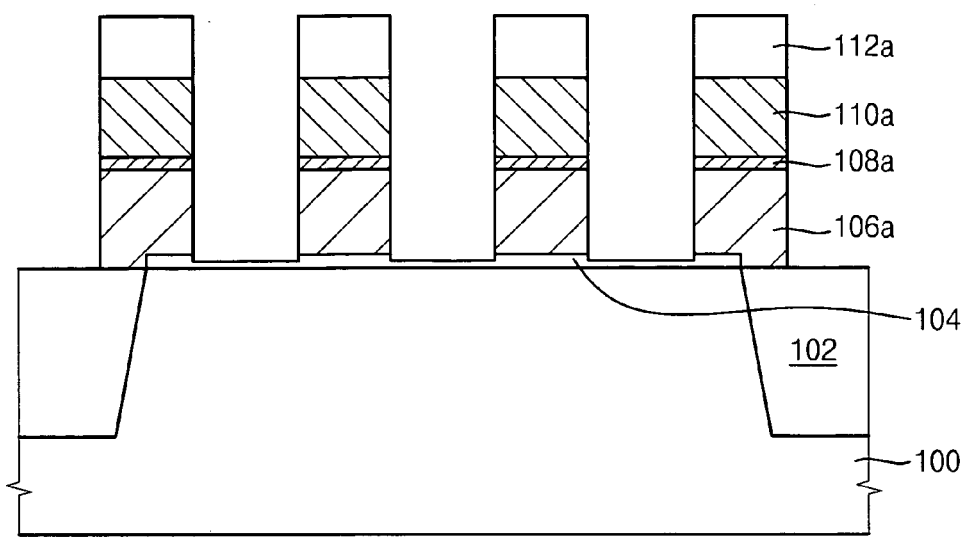
FIGS. 12 and 13 are cross sectional views illustrating a method of manufacturing a field effect transistor in accordance with a third exemplary embodiment of the present invention.
Figure 13:
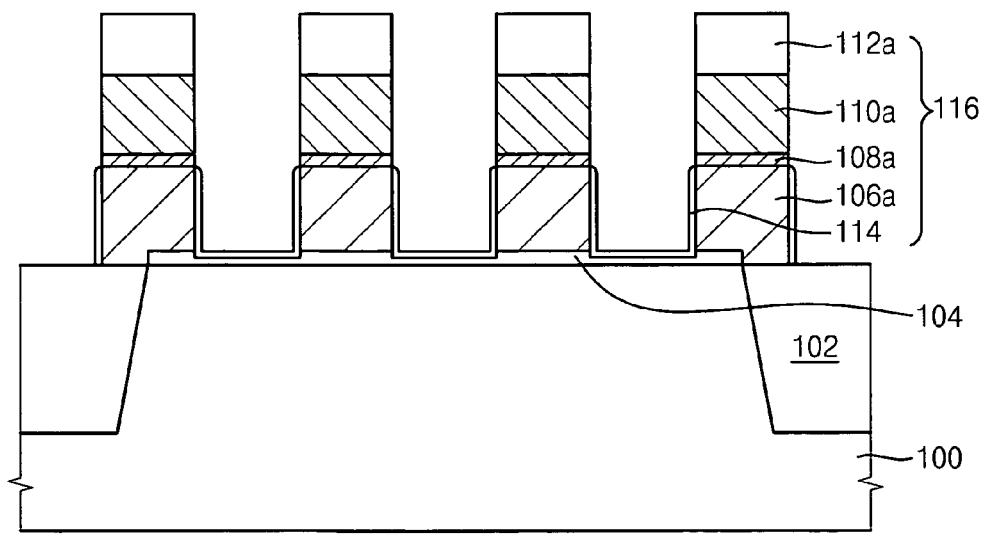

FIGS. 12 and 13 are cross sectional views illustrating a method of manufacturing a field effect transistor in accordance with Embodiment 3 of the present invention.

Referring to FIG. 12, an isolation layer 102 is formed in a trench of a silicon substrate 100 by a trench isolation process to define an active region and a field region of the semiconductor substrate 100. An exposed portion of the silicon substrate 100 is thermally treated to form a gate oxide layer on the active region.

A polysilicon layer doped with N-type impurities or P-type impurities is formed on the gate oxide layer 104. In this embodiment, the polysilicon layer is utilized as a gate electrode. Particularly, when an N-type transistor is to be formed, the polysilicon layer doped with N-type impurities is formed on the gate oxide layer 104. On the contrary, when a P-type transistor is to be formed, the polysilicon layer doped with P-type impurities is formed on the gate oxide layer 104. In a dynamic random access memory (DRAM) device, the N-type transistor is generally formed on a unit cell of the DRAM device. Thus, the polysilicon layer doped with the N-type impurities may be employed as a gate electrode of the DRAM device.

A tungsten nitride layer is then formed on the polysilicon layer. The tungsten nitride layer functions as a diffusion barrier layer for preventing tungsten atoms in a tungsten layer, which is formed by a subsequent process, from diffusing into the polysilicon layer.

The tungsten layer is formed on the tungsten nitride layer. The tungsten layer functions as to reduce an electrical resistance of the gate electrode. A silicon nitride layer serving as a hard mask is formed on the tungsten layer.

The silicon nitride layer is partially etched by a photolithograph process to form a hard mask pattern 112a for patterning the tungsten nitride layer, the tungsten layer and the polysilicon layer. The tungsten layer, the tungsten nitride layer and the polysilicon layer are successively etched using the hard mask pattern 112a as an etching mask to form a preliminary gate electrode. The preliminary gate electrode includes a polysilicon layer pattern 106a, a tungsten nitride layer pattern 108a, and a tungsten layer pattern 110a sequentially stacked.

Referring to FIG. 13, a primary oxidation process using oxygen radicals is performed on the silicon substrate 100 having the preliminary gate structure to form a second preliminary gate structure (not shown). The primary oxidation process may be substantially identical to the primary oxidation process in Embodiment 1. Further, an oxide layer 114 is formed on a sidewall of the polysilicon layer pattern 106a and a portion of the substrate 100 exposed from the second preliminary gate structures by a first oxidation process.

After performing the primary oxidation process, a hydrogen gas is applied in-situ to the substrate 100 to reduce a tungsten oxide on the tungsten pattern 110a to tungsten, thereby completing a gate structure 116 without the tungsten oxide. The hydrogen reduction process may be identical to the hydrogen reduction process in Embodiment 1.

Although not illustrated, a secondary oxidation process may be further performed so as to cure etching damage to the gate structure.

Additionally, a nitride spacer (not shown) is formed on the sidewall of the gate structure. Impurities are then implanted into the substrate to form source/drain regions. Wirings are electrically connected to the source/drain regions to complete an MOS transistor.

Embodiment 4

Hereinafter, a method of manufacturing a field effect transistor in accordance with Embodiment 4 of the present invention will be described.

Processes are performed in the same manner as illustrated with reference to FIG. 12 to form a preliminary gate structure.

A primary oxidation process using oxygen radicals is carried out on the substrate having the preliminary gate structure. Here, the primary oxidation process is performed in the same manner as in Embodiment 2.

After performing the primary oxidation process, the substrate is transferred into a transfer chamber where vacuum is provided. The substrate is then transferred into a second chamber from the transfer chamber.

A hydrogen gas is applied in-situ to the substrate to reduce tungsten oxide on the tungsten pattern to tungsten, thereby completing a gate structure without the tungsten oxide. The hydrogen reduction process may be identical to the hydrogen reduction process in Embodiment 2.

Although not illustrated, a secondary oxidation process may be further performed so as to cure etching damage to the gate structure.

Additionally, a nitride spacer (not shown) is formed on the sidewall of the gate structure. Impurities are then implanted into the substrate to form source/drain regions. Wirings are electrically connected to the source/drain regions to complete an MOS transistor.

According to the present invention, since whiskers that are generated in the oxidation process are reduced to the tungsten layer, generation of the whiskers due to a subsequent heat budget may be suppressed. Thus, a short between adjacent wirings may not be generated so that a yield of a semiconductor device may be improved. Further, since the oxygen radicals are used in the oxidation process, a punch-through phenomenon of the gate oxide layer may be suppressed.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a gate structure of a semiconductor device, comprising:
    forming a first preliminary gate structure on a substrate, the first preliminary gate structure including a gate oxide layer, a polysilicon layer pattern and a tungsten layer pattern sequentially formed on the substrate;
    primarily oxidizing the first preliminary gate structure using oxygen radicals at a first temperature for adjusting a thickness of the gate oxide layer to form a second preliminary gate structure having a partially oxidized tungsten layer pattern, wherein the partially oxidized tungsten layer includes tungsten oxide; and
    forming a gate structure by reducing the tungsten oxide in the partially oxidized tungsten layer into tungsten using a gas including hydrogen.

2. The method of claim 1, wherein forming the gate structure and performing the primary oxidation process are performed in one chamber.

3. The method of claim 2, wherein forming the gate structure comprises:
    breaking the oxygen gas used in the primary oxidation process; and
    introducing a gas including hydrogen only into the chamber.

4. The method of claim 2, wherein forming the gate structure is performed for no less than about 30 seconds.

5. The method of claim 1, wherein forming the gate structure and primarily oxidizing the first preliminary gate structure are performed in different chambers.

6. The method of claim 5, wherein forming the gate structure and primarily oxidizing the first preliminary gate structure are carried out under vacuum.

7. The method of claim 1, wherein the first temperature is within a range of about 200° C. to about 400° C.

8. The method of claim 1, wherein the gas including hydrogen is converted into hydrogen radicals, and the hydrogen radicals are then provided to the substrate.

9. The method of claim 1, wherein the gas including hydrogen comprises an $NH_3$ gas.

10. The method of claim 1, wherein forming the gate structure is performed at a temperature of about 200° C. to about 400° C.

11. The method of claim 1, wherein the primary oxidation process is carried out using an oxygen gas and a hydrogen gas.

12. The method of claim 11, wherein a flow rate of the oxygen gas is substantially no less than about 40% that of the hydrogen gas.

13. The method of claim 1, after forming the gate structure, further comprising secondarily oxidizing the gate structure to cure an etching damage of the gate structure that is generated in forming the first preliminary gate structure.

14. The method of claim 1, wherein forming the first preliminary gate structure comprises:
    forming a linear polysilicon layer pattern on the tunnel oxide layer;

sequentially forming an ONO layer and a tungsten layer on the linear polysilicon pattern; and patterning the linear polysilicon pattern, the ONO layer and the tungsten layer to form the polysilicon layer pattern, the ONO layer pattern and the tungsten layer pattern.

15. A method of forming a gate structure of a non-volatile memory device, comprising:

forming a first preliminary gate structure on a substrate, the first preliminary gate structure including a tunnel oxide layer, a first polysilicon layer pattern, an ONO layer pattern, a second polysilicon layer pattern and a tungsten layer pattern sequentially stacked on the substrate;

primarily oxidizing the first preliminary gate structure using oxygen radicals at a first temperature for adjusting a thickness of the tunnel oxide layer to form a second preliminary gate structure having a partially oxidized tungsten layer pattern, wherein the partially oxidized tungsten layer includes tungsten oxide; and forming a gate structure by reducing the tungsten oxide in the partially oxidized tungsten layer into tungsten using a gas including hydrogen.

16. The method of claim 15, wherein forming the gate structure and primarily oxidizing the first preliminary gate structure are carried out in one chamber.

17. The method of claim 16, wherein forming the gate structure comprises:

breaking the oxygen gas used in the primary oxidation process; and introducing a gas including hydrogen only into the chamber.

18. The method of claim 16, wherein forming the gate structure is performed for no less than about 30 seconds.

19. The method of claim 15, wherein forming the gate structure and primarily oxidizing the preliminary gate structure are performed in different chambers.

20. The method of claim 15, wherein a reducing agent is converted into hydrogen radicals, and the hydrogen radicals are provided to the substrate.

21. The method of claim 15, wherein the first temperature is within a range of about 200° C. to about 400° C.

22. The method of claim 15, wherein forming the gate structure is performed at a temperature of about 200° C. to about 400° C.

* * * * *